United States Patent
Ikeda et al.

(10) Patent No.: US 6,441,717 B1
(45) Date of Patent: Aug. 27, 2002

(54) PTC THERMISTER CHIP

(75) Inventors: Takashi Ikeda, Osaka; Kohichi Morimoto, Sakai; Junji Kojima, Hirataka; Kiyoshi Ikeuchi, Nishinomiya; Toshiyuki Iwao, Hirakata, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/647,657
(22) PCT Filed: Apr. 7, 1999
(86) PCT No.: PCT/JP99/01852
§ 371 (c)(1), (2), (4) Date: Dec. 15, 2000
(87) PCT Pub. No.: WO99/53504
PCT Pub. Date: Oct. 21, 1999

(30) Foreign Application Priority Data
Apr. 9, 1998 (JP) ............................................ 10-097264

(51) Int. Cl.$^7$ ................................................ H01C 7/10
(52) U.S. Cl. .................... 338/22 R; 338/328; 338/332; 338/313; 338/314
(58) Field of Search .................... 338/22 R, 225 D, 338/328, 332, 313, 314

(56) References Cited

U.S. PATENT DOCUMENTS 6,020,808 A * 2/2000 Hogge ...................... 338/22 R
6,023,403 A * 2/2000 McGuire et al. .......... 338/22 R
6,157,289 A * 12/2000 Kojima et al. ............ 338/22 R
6,172,591 B1 * 1/2001 Barrett ...................... 338/22 R

FOREIGN PATENT DOCUMENTS

| JP | 61-10203 | 1/1986 |
| JP | 5-129105 | 5/1993 |
| JP | 7-201533 | 8/1995 |
| JP | 9-69416 | 3/1997 |
| JP | 9-129414 | 5/1997 |

* cited by examiner

*Primary Examiner*—Karl D. Easthom
(74) *Attorney, Agent, or Firm*—Parkhurst & Wendel, LLP

(57) ABSTRACT

A chip polymer PTC thermistor for surface mount assembly having a superior long-term connection reliability between side electrode and main and sub electrodes. The thermister comprises; a rectangular parallelepiped conductive polymer (11) having PTC properties; a first main electrode(12a) and a first sub electrode(12b) disposed on a first face of the conductive polymer; a second main electrode(12c) and a second sub electrode(12d) disposed on a second face opposite the first face of the conductive polymer; and first and second side electrodes(13a,13b) folding around and over the entire surface of side faces of the conductive polymer, the side electrodes electrically coupling the electrodes disposed on the two faces of the conductive polymer, and a thickness of the side electrodes is not less than one twentieth of the distance between the first main electrode(12a) and the second sub electrode(12d) and the distance between the first sub electrode(12b) and second main electrode(12a,12c).

1 Claim, 19 Drawing Sheets

Connection reliability of single laminate sample
(first and second main electrodes distance: 160 μm)

(a)

(b)

(c)

(a)

(b)

(c)

(d)

(e)

Connection reliability of single laminate sample
(first and second main electrodes distance: 160 μm)

(a)

(b)

(c)

(a)

(b)

(c)

(d)

(e)

(a)

(b)

(c)

(a)

(b)

Connection reliability of triple laminate sample
(first and second main electrodes distance: 640 μm)

(a)

(b)

(a)

(b)

(c)

PTC THERMISTER CHIP

FIELD OF THE INVENTION

The present invention relates to a chip positive temperature coefficient (hereinafter, PTC) thermistor comprising conductive polymers having PTC properties.

BACKGROUND OF THE INVENTION

PTC thermistors can be used as an overcurrent protection element. When overcurrent is applied in an electric circuit, conductive polymers with PTC properties spontaneously emit heat and thermally expand to become a high resistance, thereby lowering the current to a safe small-current level.

The following is a description of a conventional PTC thermistor.

The Japanese Patent Laid-Open Publication No. S61-10203 has disclosed a PTC thermistor. This conventional PTC thermistor is constructed such that, a plurality of conductive polymer sheets and metal foils are alternately laminated and drawing-out sections are provided on opposite side faces.

FIG. 21 is a cross section of a conventional PTC thermistor.

FIG. 21 shows conductive polymer sheets 1a, 1b and 1c made with cross-linked polymer materials such as polyethylene in which conductive particles such as carbon black is mixed. Electrodes 2a, 2b, 2c and 2d made with copper or nickel, sandwich the conductive polymer sheets 1a, 1b and 1c in between them in such a manner that openings 3 are formed alternately on opposite edges of the electrodes 2a, 2b, 2c and 2d. By layering these electrodes 2a, 2b, 2c and 2d, and the conductive polymer sheet 1a, 1b and 1c alternately, a laminate 4 is formed. On side faces of drawing-out sections 5a and 5b which are electrically coupled with one-end of each of the electrodes 2a, 2b, 2c and 2d.

However, in the case of the construction of the conventional PTC thermistor, due to the considerably large differences in thermal expansion coefficients between the component materials: the thermal expansion coefficient of copper is $1.62 \times 10^{-5}$/K; nickel, $5.3 \times 10^{-5}$/K; and polyethylene, approximately $5 \times 10^{-4}$/K which increases by 1 digit at and over 130° C., mechanical stress during operation of the PTC thermistor has caused cracks, degrading the-connection points between the electrodes 2a, 2c and the drawing-out section 5a, and between the electrodes 2b, 2d and the drawing-out section 5b, and in some cases, triggered breaking of the connection.

Furthermore, since drawing-out section 5a does not extend to the lowest point of the conductive polymer sheet 1c, it has failed to be used as a component for a surface mount assembly.

To address these issues, the drawing-out section 5a of another conventional chip PTC thermistor has been extended to the lowest point of the conductive polymer sheet 1c so that it can be mounted on a surface. FIGS. 22 (a), (b) and (c) show cross sections of such PTC thermistor respectively with a single laminate, a double laminate, and a triple laminate. FIG. 23 is a cross section in which single laminate is mounted on lands 6a and 6b with solder 7a and 7b. However, even with this construction which has surface mountability, connecting point 9 of the electrode 2a and the drawing-out section 5a has suffered degradation due to cracks, and in some cases, breaking of the connection.

The present invention aims to address the foregoing problems by providing a chip PTC thermistor which achieves a superior long-term connection reliability between electrodes and drawing-out sections, namely side electrodes, and is applicable to surface mounting.

SUMMARY OF THE INVENTION

To achieve the foregoing objects, the Chip PTC thermistor of the present invention comprises;

a) a rectangular parallelepiped conductive polymer having PTC properties;

b) a first main electrode disposed on a first face of the conductive polymer;

c) a first sub electrode disposed independently, but on the same face as the first electrode;

d) a second main electrode disposed on a second face opposite the first face of the conductive polymer;

e) a second sub electrode disposed independently, but on the same face as the second main electrode;

f) a first side electrode folding around and over the entire surface of one of side faces of the conductive polymer, the first side electrode electrically coupling the first main electrode and the second sub electrode; and g) a second side electrode folding around and over the entire surface of the other side face, opposite the side face mentioned previously, of the conductive polymer, the second side electrode electrically coupling the first sub electrode and the second main electrode.

Wherein the first and second side electrodes comprise a nickel plating layer or a nickel alloy plating layer whose thickness is not less than one twentieth of the distance between the first and second main electrodes.

According to the foregoing construction of the chip PTC thermistor, the side electrodes fold around to cover not only the entire surface on the side of the conductive polymer but also to cover end surfaces of the main and sub electrodes. As such, the side electrodes and the main and sub electrodes are not linearly coupled but coupled with faces. Furthermore, the side electrodes are made with nickel which has high mechanical strength and formed with a plating layer of an even thickness equal to or thicker than one twentieth of the distance between the first and second main electrodes. Thus, the PTC thermistor of the present invention is surface mountable and shows a superior long-term connection reliability between the main and sub electrodes and the side electrodes.

DETAILED DESCRIPTION OF THE EMBODIMENTS

The First Preferred Embodiment

The chip PTC thermistor of the first preferred embodiment of the present invention is described hereinafter with reference to the accompanying drawings.

Figure 1:
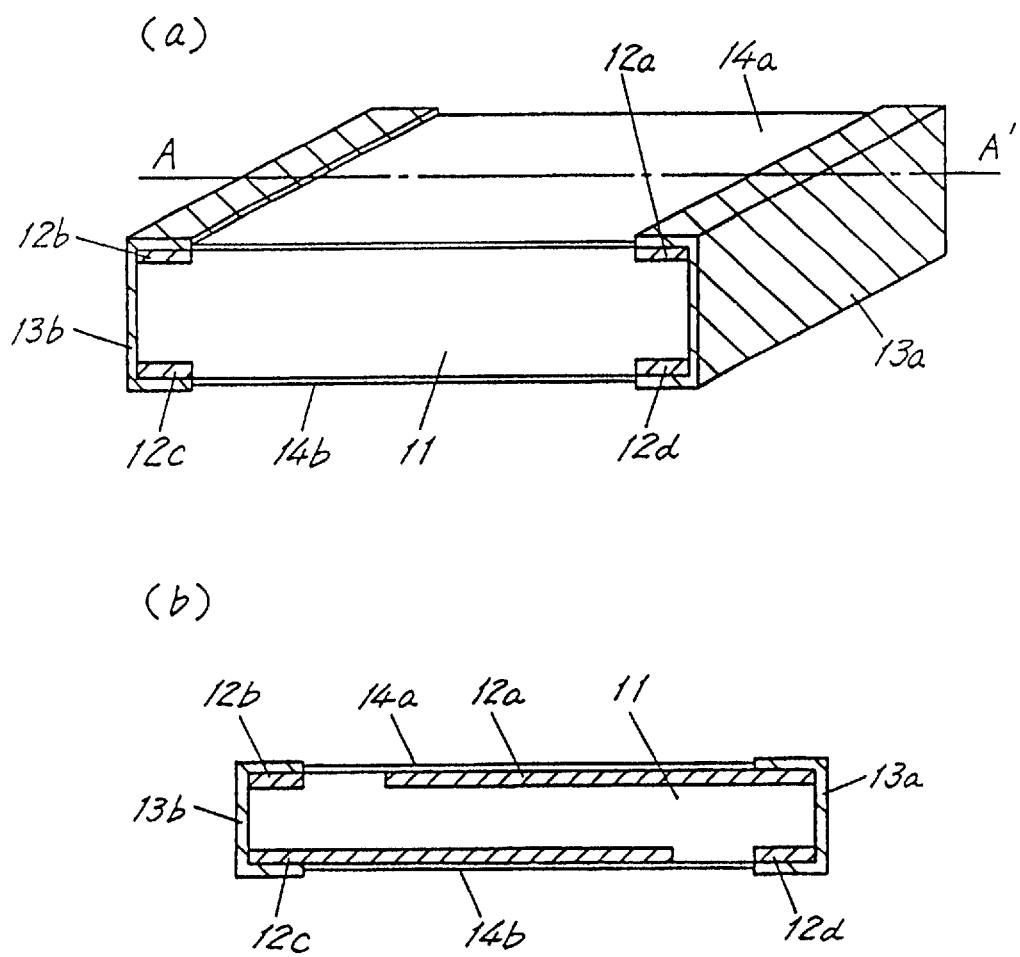
FIG. 1(a) is a perspective view of a chip PTC thermistor in accordance with a first preferred embodiment of the present invention.
FIG. 1(b) is a sectional view sectioned at the A–A' line of FIG. 1(a).

FIG. 1(a) is a perspective view of a chip PTC thermistor in accordance with the first preferred embodiment of the present invention. FIG. 1 (b) is a sectional view sectioned along the A—A' line of FIG. 1(a).

In FIGS. 1(a) and 1(b), a conductive polymer 11 is a rectangular parallelepiped conductive polymer with PTC properties comprising a mixture of a high density polyethylene which is a crystalline polymer, and carbon black, a conductive particle.

A first main electrode 12a is disposed on a first face of the conductive polymer 11, and a first sub electrode 12b is disposed independently, but on the same face as the first main electrode 12a.

A second main electrode 12c is disposed on a second face opposite the first face of the conductive polymer 11, and a second sub electrode 12d is disposed independently, but on the same face as the second main electrode 12c. All the main and sub electrodes 12a, 12b, 12c, and 12d comprise electrolytic copper foil and the like.

A first side electrode 13a made with a nickel plating layer folds around and over the entire surface of one of side faces of the conductive polymer 1 extending to the end surfaces of the first main electrode 12a and the second sub electrode 12d in such a manner that it electrically couples the first main electrode 12a and the second sub electrode 12d.

A second side electrode 13b made with a nickel plating layer folds around and over the entire surface of the other side face, opposite the first side electrode 13a, of the conductive polymer 11, extending to the end surfaces of the second main electrode 12c and the first sub electrode 12b in such a manner that it electrically couples the second main electrode 12c and the first sub electrode 12b.

First and second protective coatings 14a and 14b comprising epoxy acrylic resins are formed on the outermost layer of the first and second faces of the conductive polymer 11.

The manufacturing method of the chip PTC thermistor according to the first preferred embodiment of the present invention constructed in the foregoing manner, is described with reference to the accompanying drawings.

FIGS. 2(a)–(c) and FIGS. 3(a)–(e) are flow diagrams showing the manufacturing method of the chip PTC thermistor in accordance with the first preferred embodiment of the present invention.

Firstly, 42 wt % of high density polyethylene of the crystallinity of 70 ~90%, 57 wt % of carbon black made by furnace method , of which average particle diameter of 58 nm and specific surface area of 38 $m^2/g$, and 1 wt % of anti-oxidant, are mixed by a two roll mill heated at approximately 170° C. for about 20 minutes. The mixture is taken out from the heated roll mill in a sheet-form to obtain a conductive polymer sheet 21 with a thickness of about 0.16 mm shown in FIG. 2(a).

Figure 2:
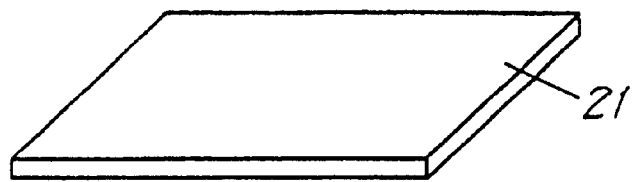
FIGS. 2(a)–(c) are flow diagrams showing manufacturing method of the chip PTC thermistor.
Figure 2:
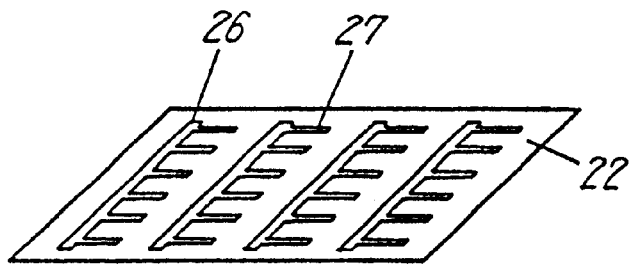
Figure 2:
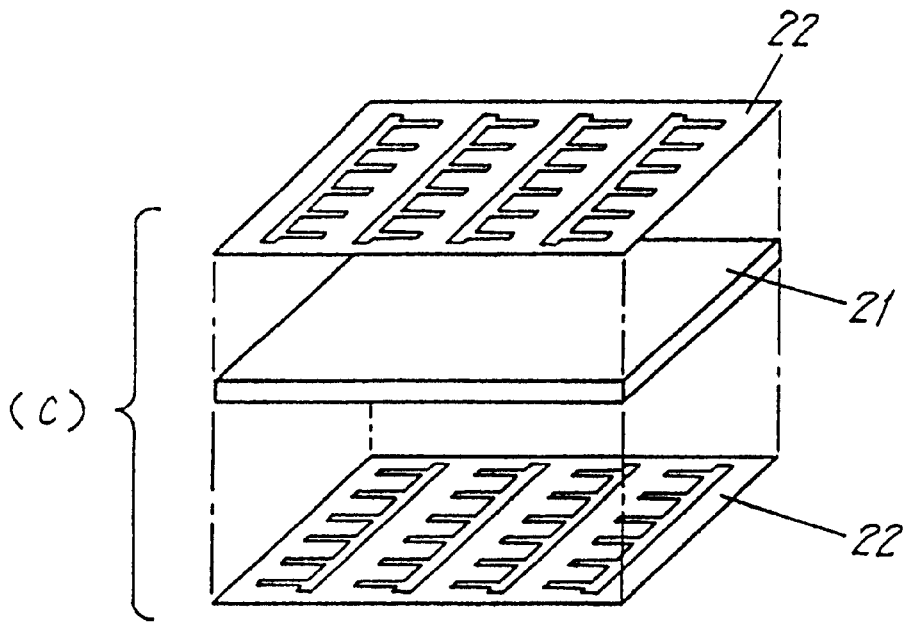

Subsequently, a pattern is formed on an electrolytic copper foil with a thickness of approximately 80 μm by a metallic mold press to prepare an electrode 22 shown in FIG. 2 (b).

In FIG. 2(b), grooves 26 are formed to provide gaps between the main and sub electrodes so that they are separated from one another when the conductive polymer sheet 21 is diced into independent elements in the following process. Grooves 27 are formed to prevent sags and flashes of the electrolytic copper foil from occurring during dicing by reducing the number of the places on the electrolytic copper foil to be cut. Other functions of the grooves 27 are to prevent the section of the electrolytic copper foil from being exposed from the side face of the element by dicing and thus oxidized, and to prevent short circuit caused by soldering during mounting.

Subsequently, the conductive polymer sheet 21 is sandwiched between the electrodes 22 as shown in FIG. 2(c). The laminate is heat-pressed in a vacuum of 20 torr for one minute at 175° C., under a pressure of 75 kg/cm², and integrated to form a sheet 23 shown in FIG. 3(a). The integrated sheet 23 is heat-treated at 110–120° C. for one hour and then irradiated by an electron beam of approximately 40 Mrad in an electron beam radiator to cross-link high density polyethylene.

Figure 3:
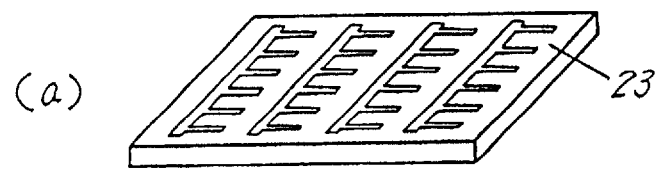
FIGS. 3(a)–(e) are flow diagrams showing manufacturing method of the Chip PTC thermistor.
Figure 3:
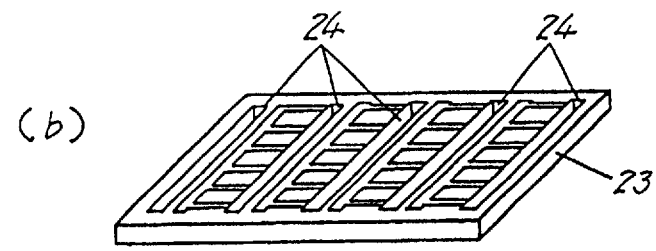
Figure 3:
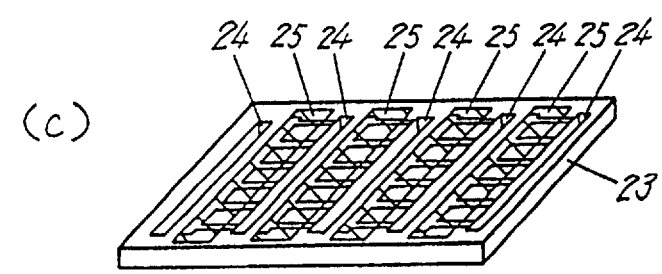
Figure 3:
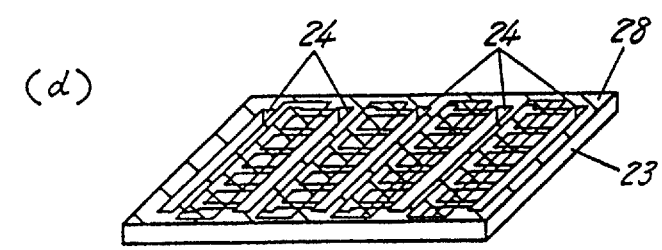
Figure 3:
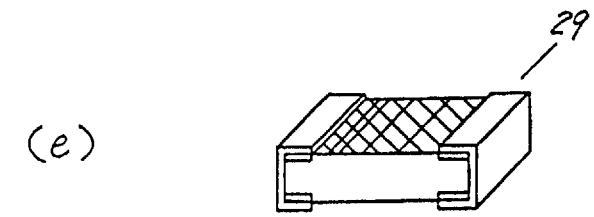

Then, as FIG. 3(b) shows, narrow through-grooves 24 are formed at predetermined intervals by dicing, such that some space is left to become the longitudinal length of desired chip PTC thermistors.

Subsequently, as FIG. 3(c) shows, epoxy mixed-acrylic resin, which is a combined-curing resins of ultraviolet curing and heat curing is screen printed on the top and bottom faces, with the exception of the vicinity of the through-grooves 24, of the sheet 23 with the through-grooves 24 formed therein. In a UV curing oven the resins are cured temporarily one face at a time, then the resins on both faces are cured fully at the same time in a heat curing oven to form protective coatings 25.

In FIG. 3(d), the sections of the sheet 23 where the protective coatings are not formed and inner walls of the through-grooves 24 are coated with a nickel plating layer of approximately 10 $\mu$m in thickness to form side electrodes 28 in a nickel sulfamate bath under the current density of 4 A/dm² for about 20 minutes.

The sheet 23 in FIG. 3(d) is then diced into independent elements to form chip PTC thermistors 29 shown in FIG. 3(e).

The chip PTC thermistors are protection components against a overcurrent: its conductive polymer thermally expands when a overcurrent flows, thus achieving a high resistance. When it is performing protective operation, large mechanical stress is applied by the thermal expansion of the conductive polymer. Repeated such protective operation may result in degradation at the connecting points of the electrodes. Therefore, it is important to obtain a long-term reliability in connections.

The following is the reasons why the side electrodes 13a and 13b are made with a nickel plating layer and folding around and over the entire surface of the side faces extending to the end surfaces of both top and bottom faces of the conductive polymer, and why their thickness is not less than one twentieth of the distance between the first and second main electrodes 12a and 12c.

To compare with the aforementioned chip PTC thermistor manufactured by the method described in the first preferred embodiment of the present invention , and whose side electrodes 13a and 13b are made with a nickel plating layer of approximately 10 $\mu$m in thickness, a sample whose side electrodes 13a and 13b are made with a copper plating layer which has been effectively used in printed circuit boards, is prepared in the following condition.

Strips of laminate are prepared by the method of the first preferred embodiment of the present invention. Side faces of the laminate strips are coated with a layer of copper plating of 10/m in thickness instead of a nickel plating layer, by plating the strip in a copper sulfate plating bath for 40 minutes under current density of 1.5 A/dm². The laminate strips are then diced into independent elements.

The following test is conducted to confirm the connection reliability between the side electrodes 13a, 13b and the main electrodes 12a, 12c and between the side electrodes 13a, 13b and the sub electrodes 12b and 12d.

In this test, 20 elements each from the two kinds of samples whose side electrodes 13a and 13b are coated respectively with a nickel plating layer and a copper plating layer of 10 $\mu$m in thickness, are mounted on a printed circuit board. As an accelerated test for thermal expansion/shrinkage, a thermal shock test is carried out until 250 cycles at a temperature of –40° C. for 30 minutes and at a temperature of 125° C. for 30 minutes. After the 100th and 250 th cycles, 10 elements each from the two samples are took out for evaluation.

Figure 4:
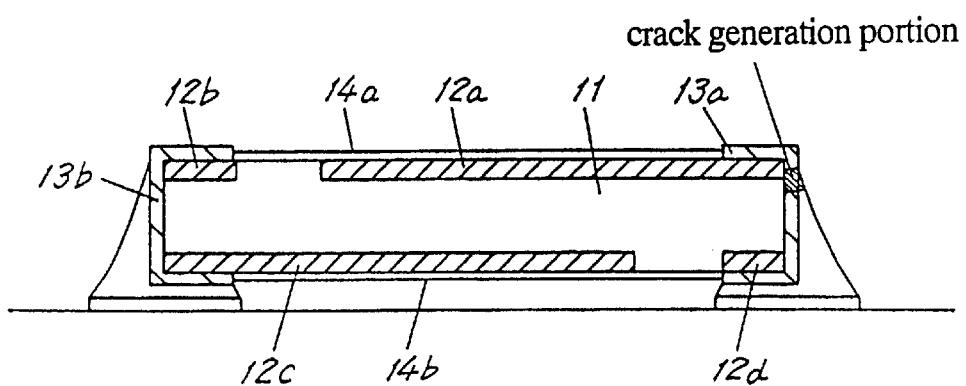
FIG. 4 is a sectional view showing cracks generated by a thermal shock test conducted on a sample with a single laminate whose side electrodes are formed with a copper plate layer.

Each sample is ground and polished vertically against the side electrodes 13a and 13b and the sections are observed to check whether cracks are generated at the junctions of side electrodes 13a, 13b with the main electrodes 12a and 12b and with the sub electrodes 12b and 12d. As a result, the samples whose side electrodes 13a and 13b are made with nickel plating layer are free of any cracks even after 250 cycles. Whereas 10 out of 10 samples prepared for comparison with the side electrodes 13a and 13b made with a copper plating layer, suffer cracks before the 100 th cycle, on the first side electrode 13a at the connection between the first side electrode 13a and the first main electrode 12a. (refer to FIG. 4)

Even when the thickness of the copper plating layer is increased to twice that of the previous samples to 20 $\mu$m, by plating the samples in a copper sulfate bath for 80 minutes under a current density of 1.5 A/dm², 10 out of 10 samples suffer cracks before the 100 th cycle. All the cracks are observed at the same place as the previous samples.

Figure 5:
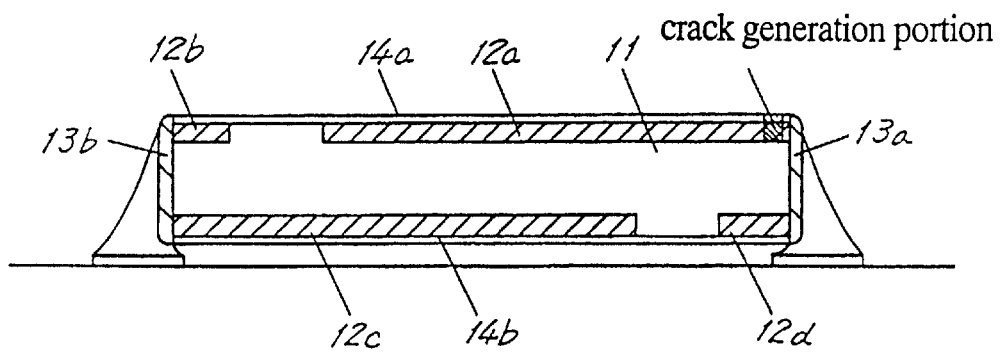
FIG. 5 is a sectional view showing cracks observed after a thermal shock test conducted on a sample of a single laminate in which side electrodes are disposed only on the side faces.

To confirm the effects of the construction of the side electrodes 13a and 13b which fold around and over the entire surface of the side faces extending to the top and bottom faces, samples are prepared by forming the side electrodes 13a and 13b with a nickel plating layer of 10 $\mu$m in thickness only on the side faces, and the same thermal shock test is conducted. After the test, the sections are observed in the same manner. As a result, 10 out of 10 samples suffer cracks, before the 100 th cycle, on the first main electrode 12a at the connection between the first side electrode 13a and the first main electrode 12a. (refer to FIG. 5)

The reasons why the thickness of the side electrodes 13a and 13b is set to be not less than one twentieth of the distance between the first and the second main electrodes 12a and 12c is described below.

Figure 6:
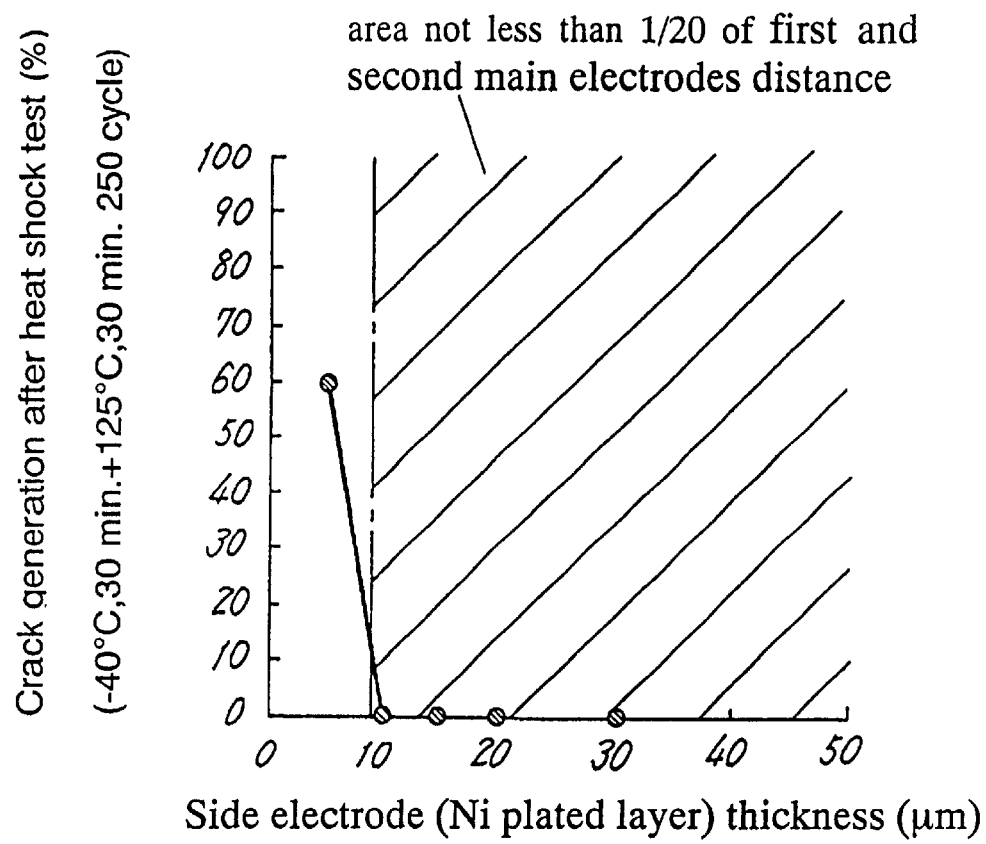
FIG. 6 is a graph showing connection reliabilities in a thermal shock test conducted on samples comprising a single laminate whose side electrodes have different thickness.

Samples whose side electrodes 13a and 13b are made with a nickel plating layers of different thickness are prepared by the manufacturing method of this embodiment. 10 elements each from the samples are used for the test. FIG. 6 is a graph showing the connection reliability observed in the thermal shock test carried out 250 cycles at a temperature of –40° C. for 30 minutes and at a temperature of 125° C. for 30 minutes on the samples whose side electrodes 13a and 13b have different thicknesses of 5 $\mu$m, 10 $\mu$m, 15 $\mu$m, 20 $\mu$m, and 30 $\mu$m.

When the thickness of the nickel plating layer, namely the side electrodes 13a and 13b is 10 $\mu$m or more, no cracks are formed. Thus, by making the thickness of the side electrodes 13a and 13b made with the nickel plating layer not less than one twentieth of the distance between the first and second main electrodes 12a and 12c, the connection reliability is improved.

As thus far described, according to the first preferred embodiment of the present invention, a surface mountable chip PTC thermistor which has a superior long term connection reliability between the main electrodes 12a and 12c as well as the sub electrodes 12b and 12d, and the side electrodes 13a and 13b can be obtained.

No upper limit for the thickness is particularly specified. However, when considering the ease of mounting (for example the ease of suction) by automatic mounting equipment, the dicing process into independent elements and the time needed for the plating process, the thickness of the nickel plating layer is preferably not more than four twentieths of the distance between the first and second main electrodes 12a and 12c.

The Second Preferred Embodiment

Figure 7:
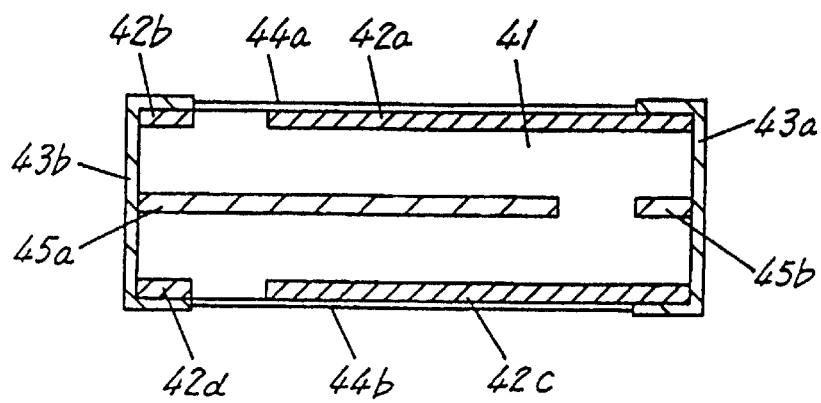
FIG. 7 is a sectional view of a chip PTC thermistor in accordance with a second preferred embodiment of the present invention.

The chip PTC thermistor of the second preferred embodiment of the present invention is described hereinafter with reference to the accompanying drawings. FIG. 7 is a sectional view of a Chip PTC thermistor in accordance with the second preferred embodiment of the present invention.

In FIG. 7, a conductive polymer 41 having PTC properties is a rectangular parallelepiped conductive polymer comprising a mixture of a high density polyethylene which is a crystalline polymer, and carbon black, a conductive particle.

A first main electrode 42a is disposed on a first face of the conductive polymer 41, and a first sub electrode 42b is disposed independently, but on the same face as the first main electrode 42a.

A second main electrode 42c is disposed on a second face opposite the first face of the conductive polymer 41, and a second sub electrode 42d is disposed independently, but on the same face as the second main electrode 42c. All the main and sub electrodes are made with electrolytic copper foil and the like.

A first side electrode 43a made with a nickel plating layer folds around and over entire surface of one of the side faces of the conductive polymer 41 extending to the end surfaces of the first main electrode 42a and the second main electrode 42c in such a manner that it electrically couples the first main electrode 42a and the second main electrode 42c.

A second side electrode 43b made with a nickel plating layer folds around and over the entire surface of the other side face, opposite the first side electrode 43a, of the conductive polymer 41, extending to the end surfaces of the first sub electrode 42b and the second sub electrode 42d in such a manner that it electrically couples the first sub electrode 42b and the second sub electrode 42d.

First and second protective coatings 44a and 44b are made with epoxy-mixed acrylic resins.

An internal main electrode 45a is disposed inside the conductive polymer 41 in such a manner that it is parallel to the first main electrode 42a and the second main electrode 42c, and electrically connected to the second side electrode 43b. An internal sub electrode 45b is disposed on the same plane but independently from the internal main electrode 45a, and is electrically connected to the first side electrode 43a.

The manufacturing method of the chip PTC thermistor according to the second preferred embodiment of the present invention constructed in the foregoing manner, is described with reference to the accompanying drawings.

FIGS. 8(a)–(c) and FIGS. 9(a)–(e) are flow diagrams showing the manufacturing method of the chip PTC thermistor in accordance with the second preferred embodiment of the present invention.

Figure 8:
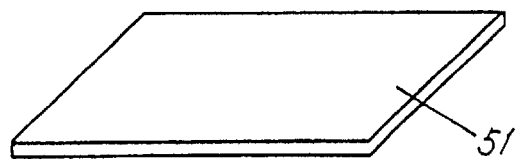
FIGS. 8(a)–(c) are flow diagrams showing manufacturing method of the chip PTC thermistor.
Figure 8:
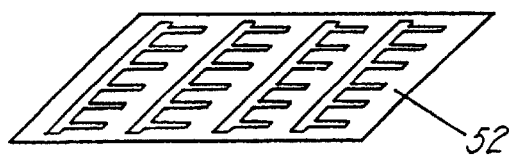
Figure 8:
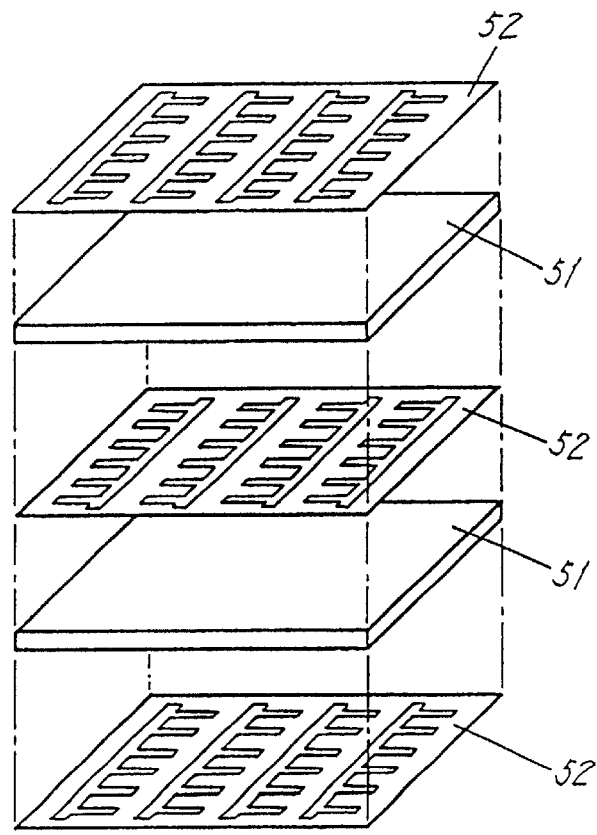

A conductive polymer sheet 51 shown in FIG. 8(a) is prepared in the same manner as in the first preferred embodiment of the present invention, and subsequently, a pattern is formed on an electrolytic copper foil. of approximately 80μm in thickness by a metallic mold press to form an electrode 52 shown in FIG. 8(b). The conductive polymer sheet 51 and the electrode 52 are laminated alternately as shown in FIG. 8(c). A laminate is then integrated by heat pressing to form a sheet 53 shown in FIG. 9(a).

As FIGS. 9(b) and(c) show, the same processes as in the first preferred embodiment are followed, except for the process of forming a side electrode 56. This process is modified so that the thickness of the nickel plating layer becomes one twentieth of the distance between the first and second main electrodes 42a and 42c. In this process, the sheet is plated in a nickel sulfamate bath for about 40 minutes under the current density of 4 A/dm$^2$ to form a nickel plating layer of 20μm in thickness. FIGS. 9(b) and(c) show through-grooves 54 formed on the sheet 53 and protective coatings 55 formed on the top and bottom faces of the sheet 53.

The sheet 53 in FIG. 9(d) then is diced into independent elements to form chip PTC thermistors 57 shown in FIG. 9(e).

The following is the reasons why the side electrodes 43a and 43b are made with a nickel plating layer and folding around and over the entire surface of the side face extending to the end surfaces of both top and bottom faces of the conductive polymer, and why their thickness is not less than one twentieth of the distance between the first and second main electrodes 42a and 42c.

To compare with the chip PTC thermistor manufactured by the method described in this embodiment of the present invention whose side electrodes 43a and 43b are made with a nickel plating layer of approximately 20 μm in thickness, a sample whose side electrodes 43a and, 43b are made with a copper plating layer which has been practically used in printed circuit boards production, is prepared by the following method. Strips of laminate are prepared by the method of this embodiment of the present invention. Side faces of the laminate strips are plated with a copper of 20 μm in thickness instead of a nickel plating layer, in a copper sulfate plating bath for 80 minutes under current density of 1.5 A/dm$^2$, and the laminate strips are diced into independent elements.

The following test is conducted to confirm the connection reliability between the side electrodes 43a, 43b and the main electrodes 42a, 42c and between the side electrodes 43a, 43b and the side electrodes 42b, 42d.

In this test, 20 elements each from the two kinds of samples whose side electrodes 43a and 43b are coated respectively with a nickel plating layer and a copper plating layer of 20 μm in thickness, are mounted on a printed circuit board. As an accelerated test for thermal expansion/shrinkage, a thermal shock test is carried out up to 250 cycles at a temperature of −40° C. for 30 minutes and at a temperature of 125° C. for 30 minutes. After the 100 th and 250th cycles, 10 elements each from the two samples are took out for evaluation.

Figure 10:
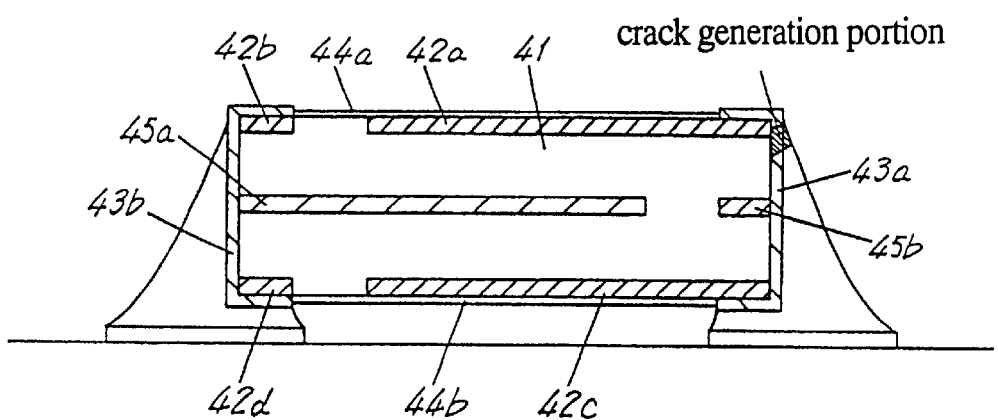
FIG. 10 is a sectional view showing cracks generated by a thermal shock test conducted on a sample of a double laminate whose side electrodes are formed with copper plate.

Each sample is ground and polished vertically against the side electrodes 43a and 43b and the sections are observed to check whether cracks are generated at the junctions of side electrodes 43a, 43b with the main electrodes 42a and 42b and with the sub electrodes 42b and 42d. As a result, the samples whose side electrodes 43a and 43b are made with a nickel plating layer, suffer no cracks even after 250 cycles. Whereas 10 out of 10 samples prepared for comparison with the side electrodes 43a and 43b made with copper plating layer, suffer cracks before the 100 th cycle, on the first side electrode 43a at the connection between the first side electrode 43a and the first main electrode 42a. (refer to FIG. 10)

Even when the thickness of copper plating layer is increased to twice that of the previous samples to 40 μm, by plating the samples in a copper sulfate bath for 160 minutes under a current density of 1.5 A/dm$^2$, 10 out of 10 samples suffer cracks before the 100th cycle. All the cracks are observed at the same place as the previous samples.

Figure 11:
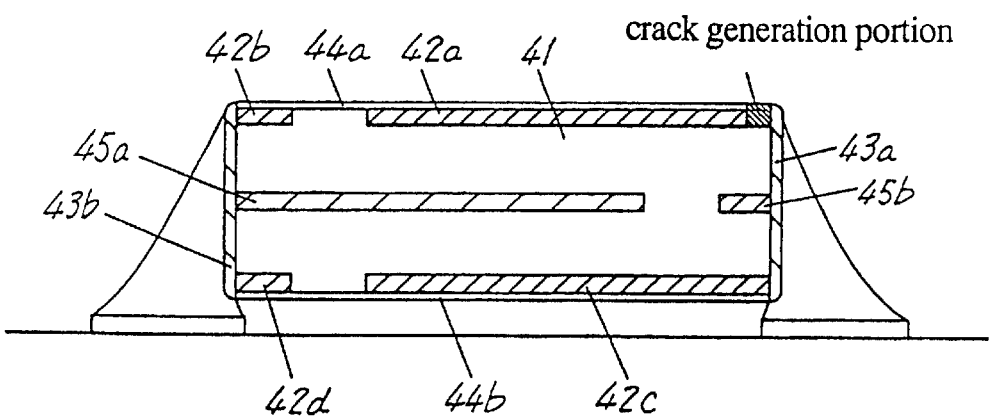
FIG. 11 is a sectional view showing cracks generated by a thermal shock test conducted on a sample with a double laminate in which side electrodes are disposed only on the side faces.

To confirm the effects of the construction of the side electrodes 43*a* and 43*b* which fold around and over the entire surface of the side faces extending to the top and bottom faces, samples are prepared such that the side electrodes 43*a* and 43*b* are made with a nickel plating layer of 20 μm in thickness and are disposed only on the side faces. The same thermal shock test is then conducted. When the sections are observed in the same manner after the test, 10 out of 10 samples are found to have cracks on the first main electrode 42*a* at the connection between the first side electrode 43*a* and the first main electrode 42*a* before the 100 th cycle. (refer to FIG. 11)

The reasons why the thickness of the side electrodes 43*a* and 43*b* is set to be not less than one twentieth of the distance between the first and the second main electrodes 42*a* and 42*c* is described below.

Figure 12:
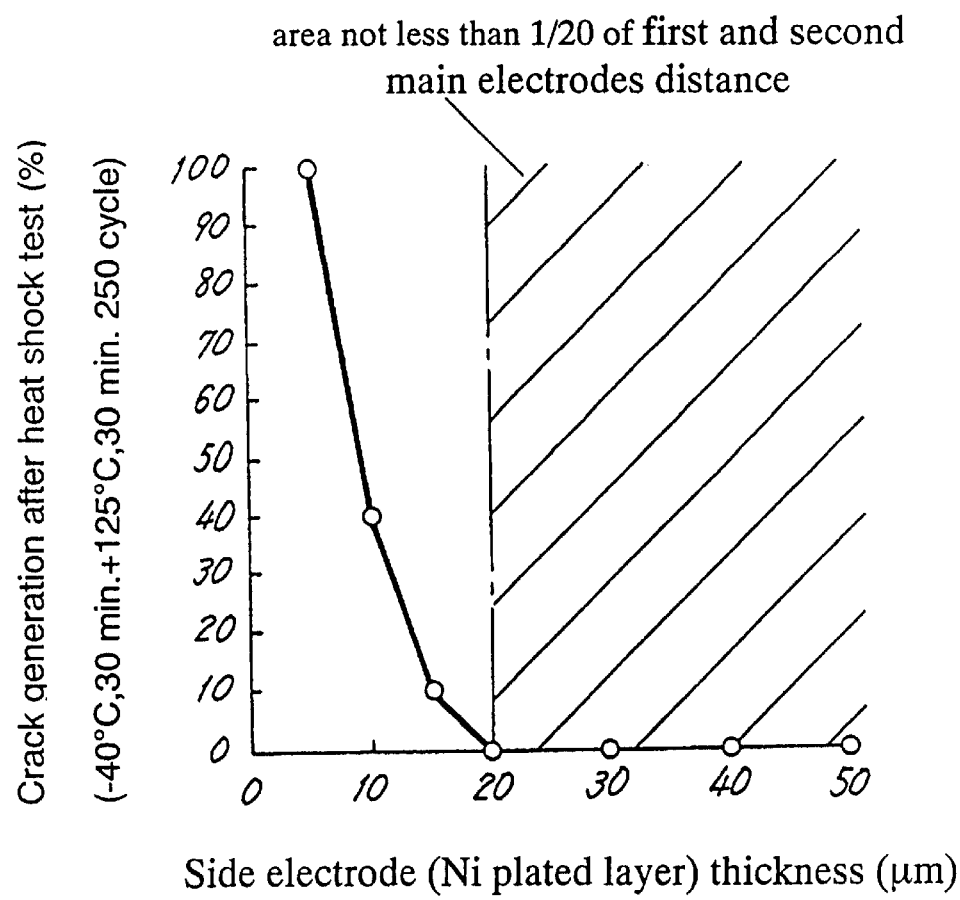
FIG. 12 is a graph showing connection reliabilities in a thermal shock test conducted on samples comprising a double laminate whose side electrodes have different thickness.

Samples whose side electrodes 43*a* and 43*b* are made with nickel plating layers of different thickness are prepared by the manufacturing method of this preferred embodiment of the present invention. 10 elements each from the samples are used for the test. FIG. 12 is a graph showing the connection reliability observed in the thermal shock test carried out at 250 cycles at a temperature of −40° C. for 30 minutes and at a temperature of 125° C. for 30 minutes on the samples whose side electrodes 43*a* and 43*b* have different thicknesses of 5 μm, 10 μm, 15 μm, 20 μm, 30 μm, 40 μm and 50 μm. When the thickness of the nickel plating layer, namely the side electrodes 43*a* and 43*b*, is 20 μm or more, no cracks are formed. Thus, by making the thickness of the side electrodes 43*a* and 43*b* made with the nickel plating layer, not less than one twentieth of the distance between the first and second main electrodes 42*a* and 42*c*, the connection reliability is improved.

As thus far described, according to the second preferred embodiment of the present invention, a surface mountable chip PTC thermistor having a long term connection reliability between the side electrodes 43*a*, 43*b* and the main electrodes 42*a*, 42*c* as well as the sub electrodes 42*b*, 42*d* can be obtained even when it is formed such that the conductive polymer and the metallic foil are alternately laminated in order to increase the current-carrying capacity while reducing the size.

No upper limit for the thickness is particularly specified. However, when considering the ease of mounting (for example the ease of suction) by an automatic mounting equipment, the process of dicing into independent elements and the time needed for the plating process, the thickness of the nickel plating layer is preferably not more than four twentieths of the distance between the first and second main electrodes.

The Third Preferred Embodiment

Figure 13:
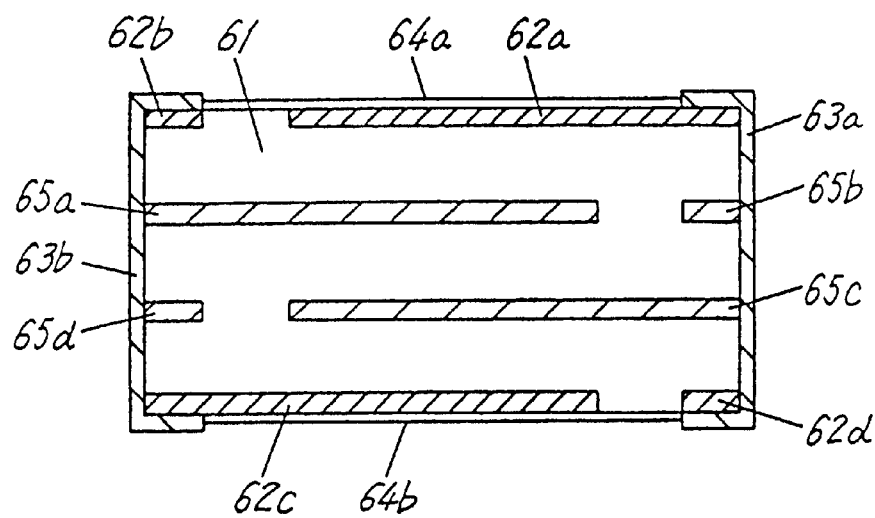
FIG. 13 is a sectional view of chip PTC thermistor in accordance with a third preferred embodiment of the present invention.

The chip PTC thermistor of the third preferred embodiment of the present invention is described hereinafter with reference to the accompanying drawings. FIG. 13 is a sectional view of a chip PTC thermistor in accordance with the third preferred embodiment of the present invention.

In FIG. 13, a conductive polymer 61 having PTC properties is a rectangular parallelepiped conductive polymer comprising a mixture of a high density polyethylene which is a crystalline polymer, and carbon black, a conductive particle.

A first main electrode 62*a* is located on a first face of the conductive polymer 61, and a first sub electrode 62*b* is disposed independently, but on the same face as the first main electrode 62*a*.

A second main electrode 62*c* is located on a second face opposite the first face of the conductive polymer 61, and a second sub electrode 62*d* is disposed independently, but on the same face as the second main electrode 62*c*. All the main and sub electrodes are made with electrolytic copper foil.

A first side electrode 63*a* made with a nickel plating layer is disposed such that it folds around and over the entire surface of one of the side faces of the conductive polymer 61 extending to the end surfaces of the first main electrode 62*a* and the second sub electrode 62*d* in such a manner that it electrically couples the first main electrode 62*a* and the second sub electrode 62*d*.

A second side electrode 63*b* made with a nickel plating layer, folds around and over the entire surface of the other side face opposite the first side electrode 63*a* of the conductive polymer 61, extending to the end surfaces of the first sub electrode 62*b* and the second main electrode 62*c* in such a manner that it electrically couples the first sub electrode 62*b* and the second main electrode; 62*c*.

First and second protective coatings 64*a* and 64*b* are made with epoxy-mixed acrylic resins.

A first internal main electrode 65*a* is disposed inside the conductive polymer 61 in such a manner that it is parallel to the first and second main electrodes 62*a* and 62*c*, and electrically connected to the second side electrode 63*b*. A first internal sub electrode 65*b* is disposed on the same plane but independently from the first internal main electrode 65*a*, and is electrically connected to the first side electrode 63*a*.

A second internal main electrode 65*c* is disposed inside the conductive polymer 61 in such a manner that it is parallel to the first main electrode 62*a* and the second main electrode 62*c*, and electrically connected to the first side electrode 63*a*. A second internal sub electrode 65*d* is disposed on the same plane but independently from the second internal main electrode 65*c*, and is electrically connected to the second side electrode 63*b*.

The manufacturing method of the chip PTC thermistor according to the third preferred embodiment of the present invention is described with reference to the accompanying drawings.

Figure 9:
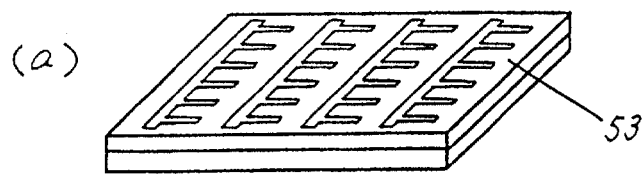
FIGS. 9(a)–(e) are flow diagrams showing manufacturing method of the chip PTC thermistor.
Figure 9:
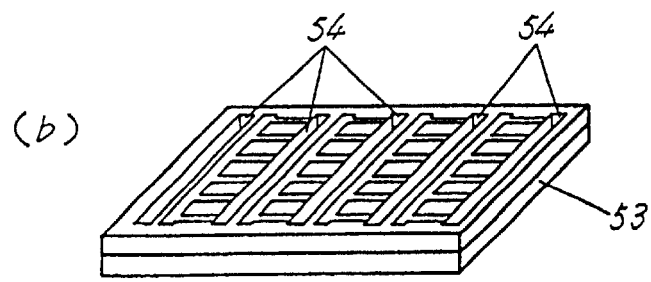
Figure 9:
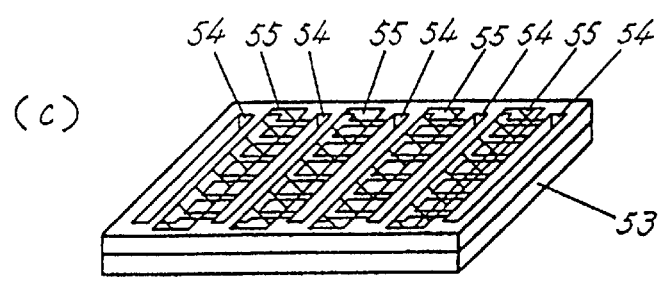
Figure 9:
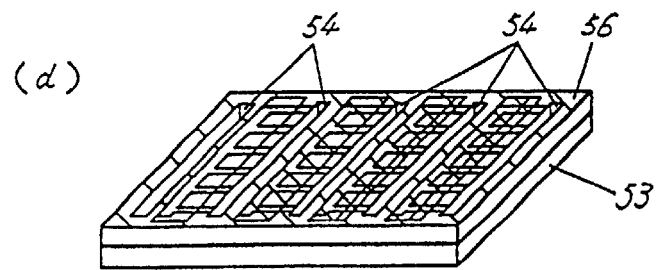
Figure 9:
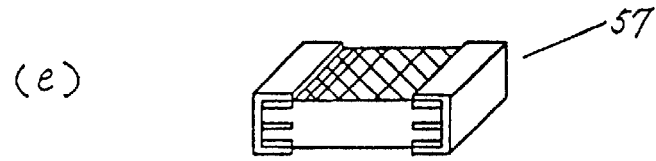
Figure 14:
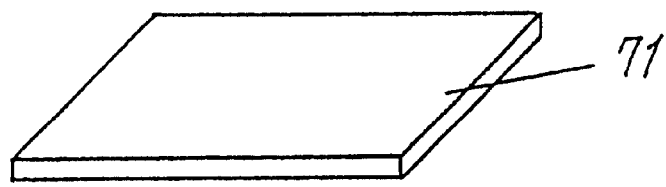
FIGS. 14(a)–(c) are flow diagrams showing manufacturing method of the chip PTC thermistor.
Figure 14:
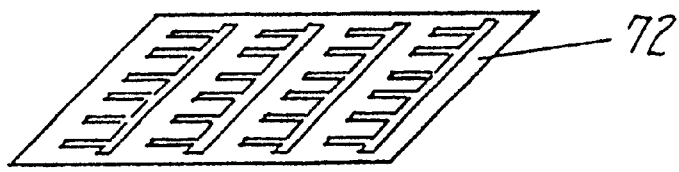
Figure 14:
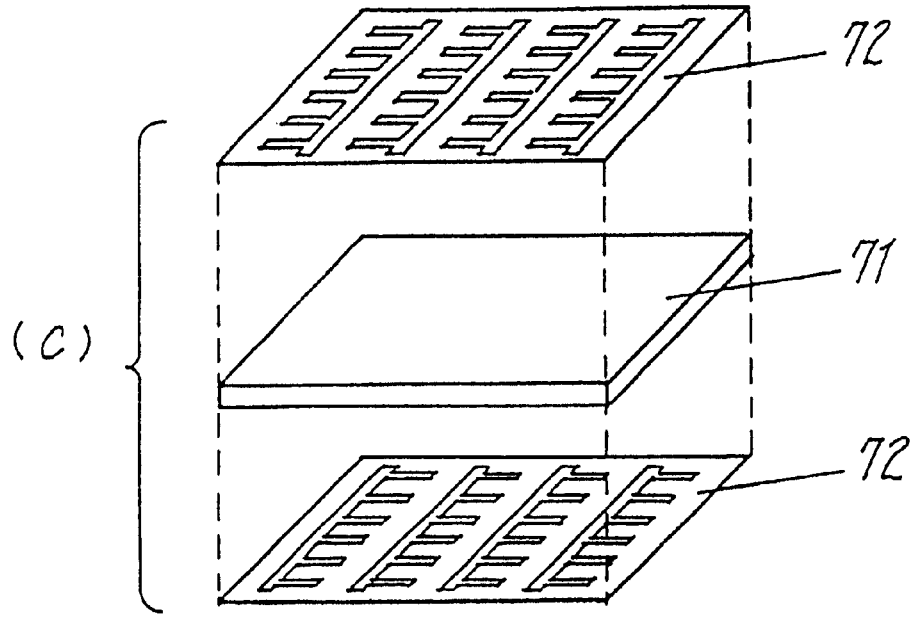
Figure 15:
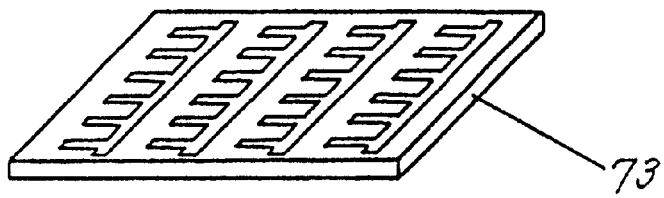
FIGS. 15(a) and (b) are flow diagrams showing manufacturing method of the chip PTC thermistor.
Figure 15:
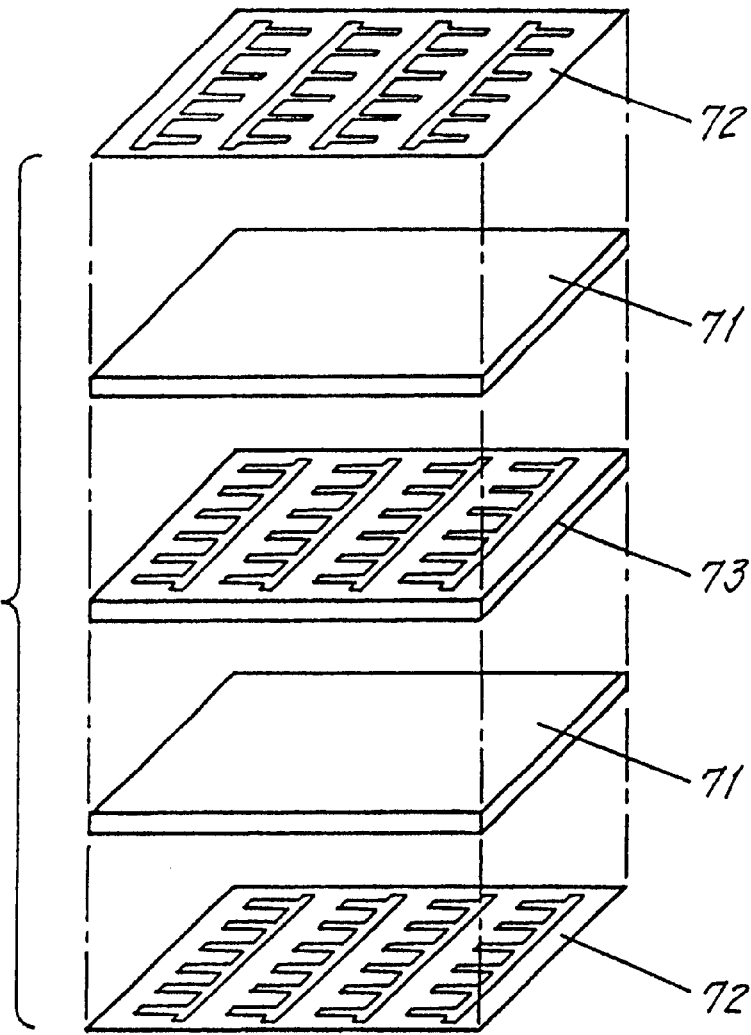

FIGS. 14(*a*)–(*c*), FIGS. 15(*a*) and(*b*), and FIGS. 9(*a*)–(*e*) are flow diagrams showing the manufacturing method of the third preferred embodiment of the present invention.

A conductive polymer sheet 71 shown in FIG. 14(*a*) is prepared in the same manner as in the first preferred embodiment of the present invention, and subsequently, a pattern is formed on an electrolytic copper foil of approximately 80 μm in thickness by a metallic mold press to form an electrode 72 shown in FIG. 14(*b*).

As FIG. 14(*c*) shows, the conductive polymer sheet 71 is sandwiched between two pieces of the electrodes 72. The laminate is then integrated by heat pressing to form a sheet 73 shown in FIG. 15(*a*).

As FIG. 15(*b*) shows, a first sheet 73 is sandwiched between two conductive polymer sheets and then by two pieces of the electrodes 72 so that the electrodes 72 are disposed on the outermost layers of the laminate. The laminate is then heat pressed to obtain a second sheet 74 shown in FIG. 16(*a*).

Figure 16:
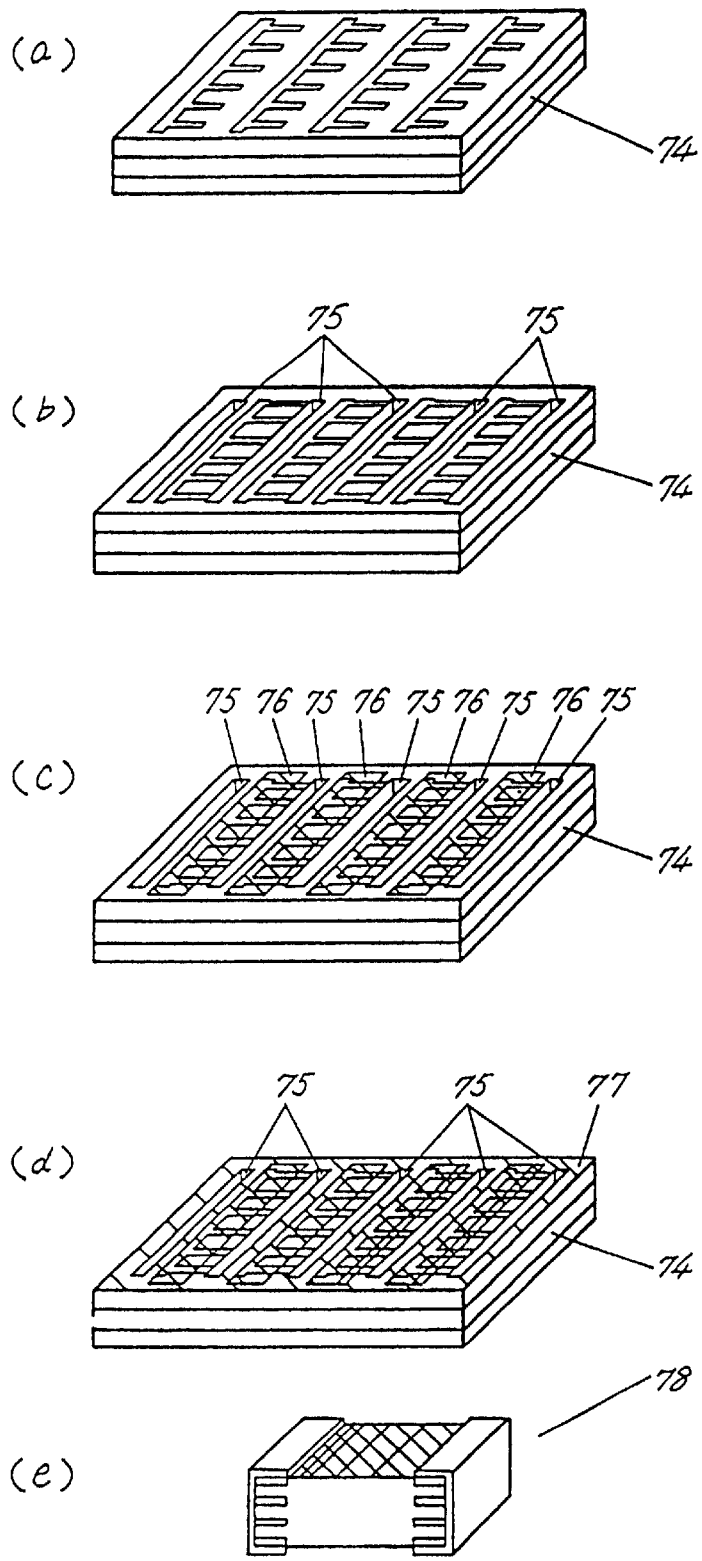
FIGS. 16(a)–(e) are flow diagrams showing manufacturing method of the chip PTC thermistor.

As FIGS. 16(*b*) and(*c*) show, the same processes as the first preferred embodiment are followed, except for the process of forming a side electrode 77. This process is modified so that the thickness of the nickel plating layer becomes one twentieth of the distance between the first and second main electrodes 62*a* and 62*c*. To obtain the nickel plating layer of that thickness, in this process, the laminate is plated in a nickel sulfamate bath for about 70 minutes under the current density of 4 A/dm$^2$ and the nickel plating layer of 35 μm in thickness is formed. FIGS. 16(*b*) and(*c*)

show through-grooves 75 formed on the second sheet 74 and protective coatings 76 formed on the top and bottom faces of the second sheet 74.

The second sheet 74 shown in FIG. 16(*d*) is then diced into independent elements to obtain chip PTC thermistors 78 shown in FIG. 16(*e*).

The following is the reasons why the side electrodes 63*a* and 63*b* are made with a nickel plating layer and folding around and over the entire surface of the side faces extending to the end surfaces of both top and bottom faces of the conductive polymer, and why their thickness is not less than one twentieth of the distance between the first and second main electrodes 62*a* and 62*c*.

To compare with the chip PTC thermistor manufactured by the method described in this preferred embodiment of the present invention whose side electrodes 63*a* and 63*b* are made with a nickel plating layer of approximately 35 μm in thickness, a sample whose side electrodes 63*a* and 63*b* are made with a copper plating layer which has been practically used in printed circuit boards , is prepared in the following method. Strips of laminate are prepared by the method of the third preferred embodiment of the present invention. Side faces of the laminate strips are plated with copper of approximately 35 μm in thickness instead of a nickel plating layer, by plating the strips in a copper sulfate plating bath for 140 minutes under current density of 1.5 A/dm$^2$.

The following test is conducted to confirm the connection reliability between the side electrodes 63*a* and 63*b* and the main electrodes 62*a* and 62*c* and the side electrodes 62*b* and 62*d*.

In this test, 20 elements each from the two kinds of samples whose side electrodes 63*a* and 63*b* are coated respectively with a nickel plating layer and a copper plating layer of 35 μm in thickness, are mounted on a printed circuit board. As an accelerated test for thermal expansion/shrinkage, a thermal shock test is carried out up to 250 cycles at a temperature of −40° C. for 30 minutes and at a temperature of 125° C. for 30 minutes. After the 100th and 250th cycles, 10 elements each from the two samples are took out for evaluation.

Figure 17:
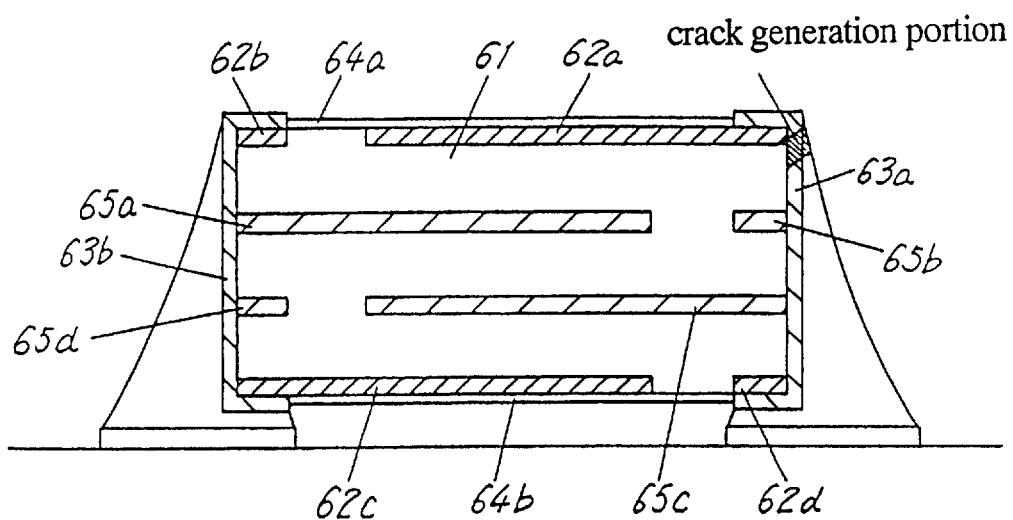
FIG. 17 is a sectional view showing cracks generated by a thermal shock test conducted on a sample with a triple laminate whose side electrodes are formed with copper plate.

Each sample is ground and polished vertically against the side electrodes 63*a* and 63*b* and the sections are observed to check whether cracks are generated at the junctions of side electrodes 63*a*, 63*b* with the main electrodes 62*a*, 62*c* and with the sub electrodes 62*b* and 62*d*. As a result, the samples whose side electrodes 63*a* and 63*b* are made with a nickel plating layer, are free of any cracks even after 250 cycles. Whereas 10 out of 10 samples prepared for comparison with the side electrodes 63*a* and 63*b* made with copper plating layer, suffer cracks before the 100th cycle, on the first side electrode 63*a* at the connection between the first side electrode 63*a* and the first side electrode 63*a*. (refer to FIG. 17)

Even when the thickness of copper plating layer is increased to twice that of the previous samples to 70 μm, by plating the samples in a copper sulfate bath for 280 minutes under a current density of 1.5 A/dm$^2$, 10 out of 10 samples suffer cracks before the 100th cycle. All the cracks are observed at the same place as the previous samples.

Figure 18:
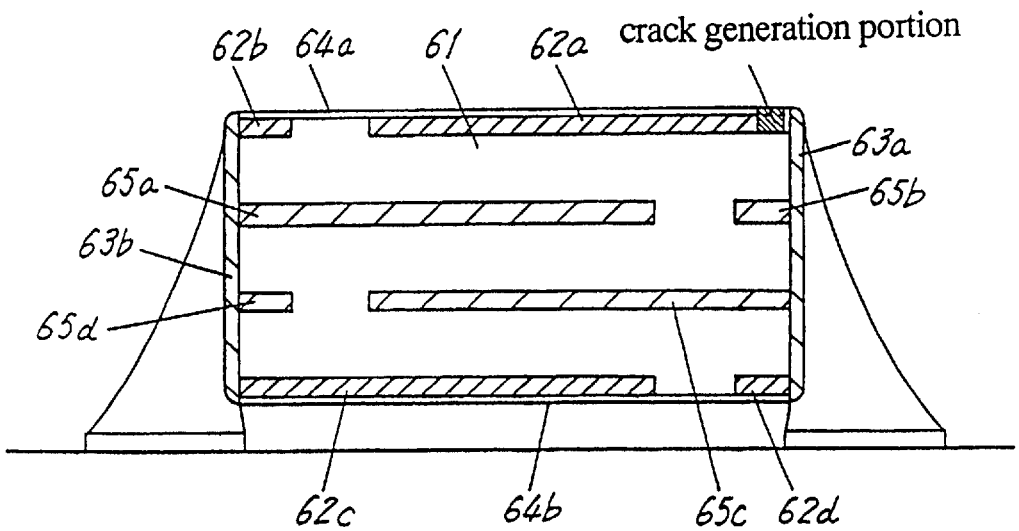
FIG. 18 is a sectional view showing cracks generated by a thermal shock test conducted on a sample of a triple laminate in which side electrodes are disposed only on the side faces.

To confirm the effects of the construction of the side electrodes 63*a* and 63*b* which fold around and over the entire surface of the side faces extending to the part of the top and bottom faces, samples are prepared by forming the side electrodes 63*a* and 63*b* with a nickel plating layer of 35 μm in thickness only on the side faces, and the same thermal shock test is conducted. After the test, the sections are observed in the same manner. As a result, 10 out of 10 samples suffer cracks before the 100th cycle, on the first main electrode 62*a* at the connection between the first side electrode 63*a* and the first main electrode 62*a*. (refer to FIG. 18)

The reasons why the thickness of the side electrodes 63*a* and 63*b* is set to be not less than one twentieth of the distance between the first and the second main electrodes 62*a* and 62*c* is described below.

Samples whose side electrodes 63*a* and 63*b* are made with nickel plating layers of different thickness are prepared by the manufacturing method the same as this preferred embodiment of the present invention. 10 units each from the samples are used for the test.

Figure 19:
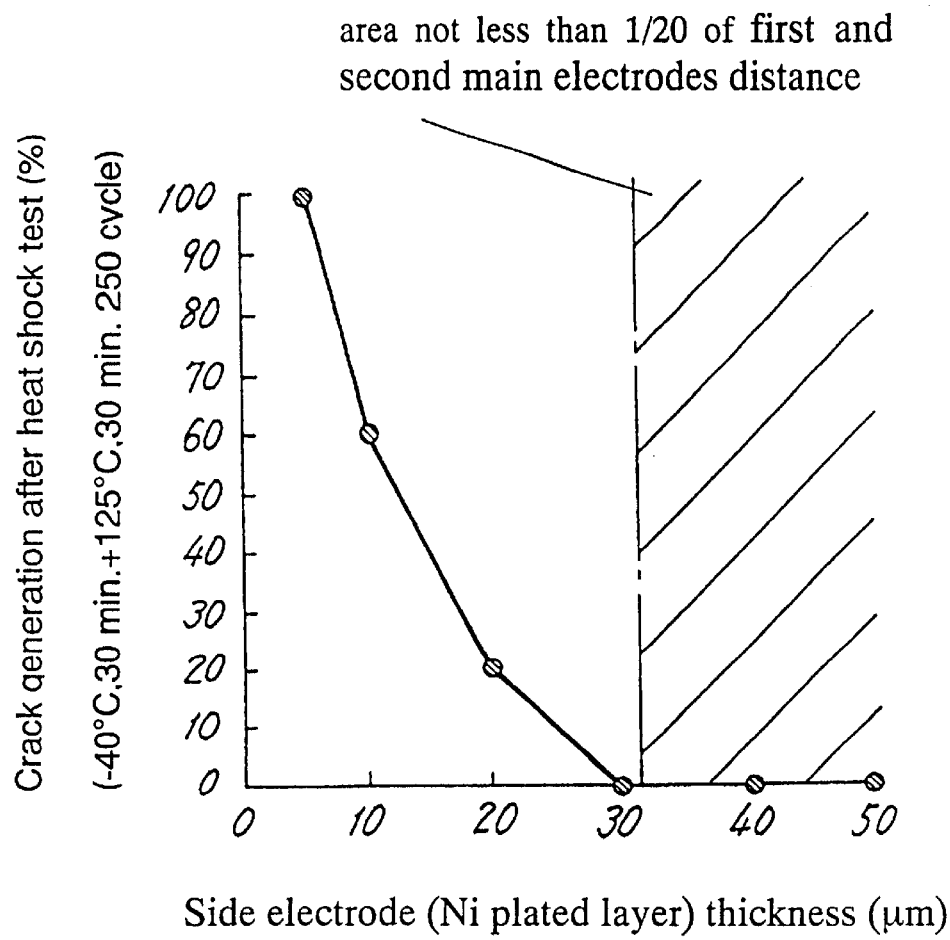
FIG. 19 is a graph showing connection reliabilities in a thermal shock test conducted on samples comprising a triple laminate whose side electrodes have different thickness.

FIG. 19 is a graph showing the connection reliability observed in the thermal shock test carried out up to 250 cycles at a temperature of −40° C. for 30 minutes and at a temperature of 125° C. for 30 minutes on the samples whose side electrodes 63*a* and 63*b* have different thicknesses of 5 μm, 10 μm, 15 μm, 20 μm, 30 μm, 40 μm, and 50 μm.

When the thickness of the nickel plating layer, namely the side electrodes 63*a* and 63*b* is 30 μm or more, no cracks are formed. Thus, by making the thickness of the side electrodes 63*a* and 63*b* made with the nickel plating layer not less than one twentieth of the distance between the first and second main electrodes 12*a* and 12*c*, the connection reliability is improved.

Figure 20:
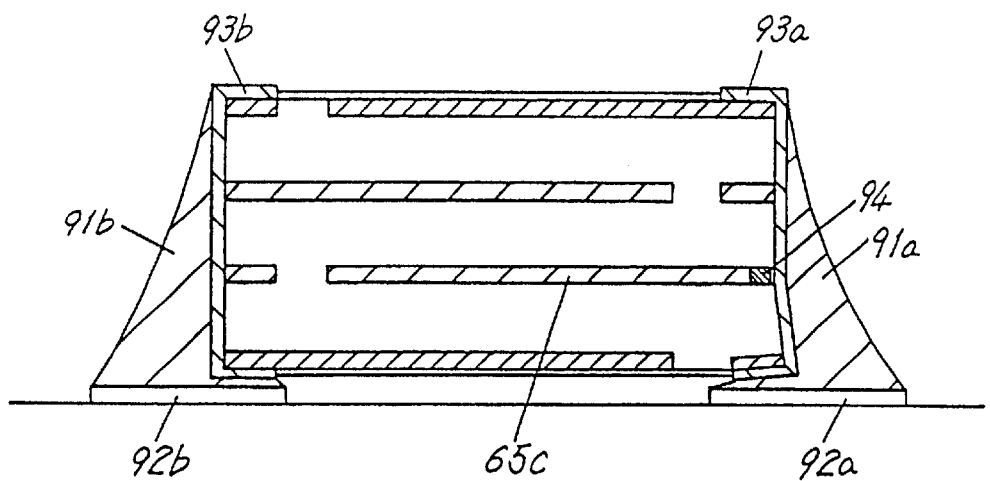
FIG. 20(a) is a sectional view showing one sample with cracks caused by a thermal shock test.
FIG. 20(b) is a sectional view showing one sample with no cracks caused by a thermal shock test.
Figure 20:
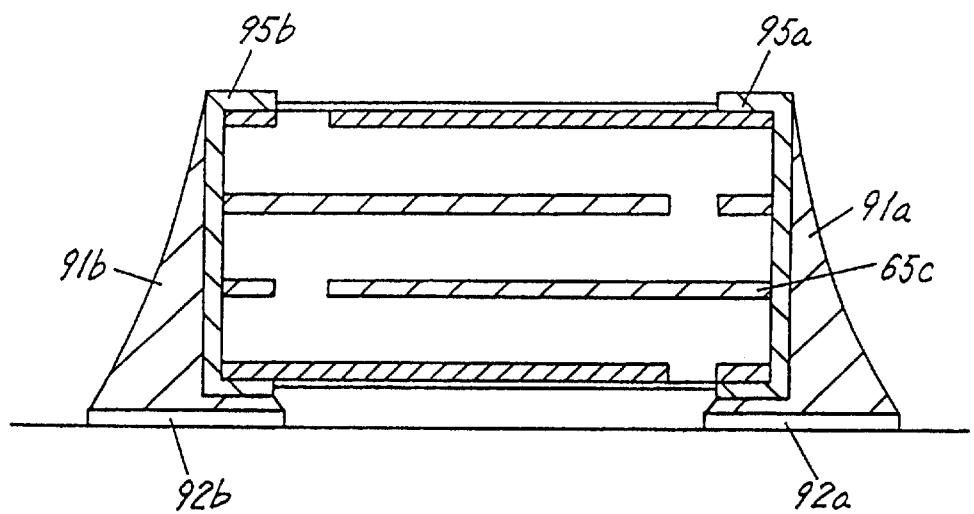
Figure 21:
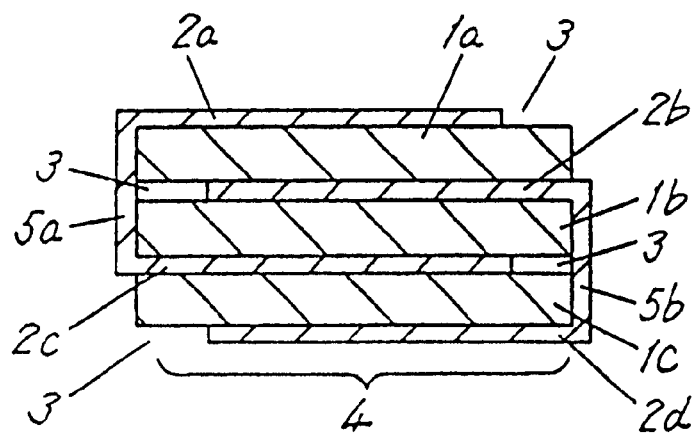
FIG. 21 is a sectional view of a conventional PTC thermistor.
Figure 22:
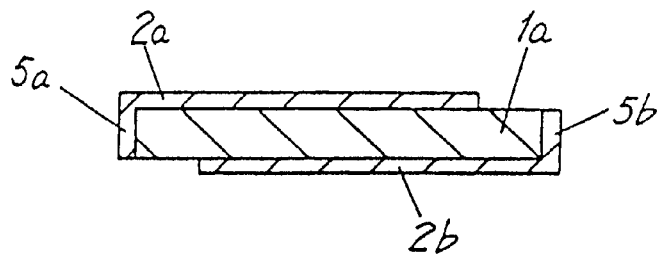
FIG. 22(a) is a sectional view of a conventional PTC thermistor with a single laminate made to be surface mountable.
FIG. 22(b) is a sectional view of a conventional PTC thermistor with a double laminate made to be surface mountable.
FIG. 22(c) is a sectional view of a conventional PTC thermistor with triple laminate made to be surface mountable.
Figure 22:
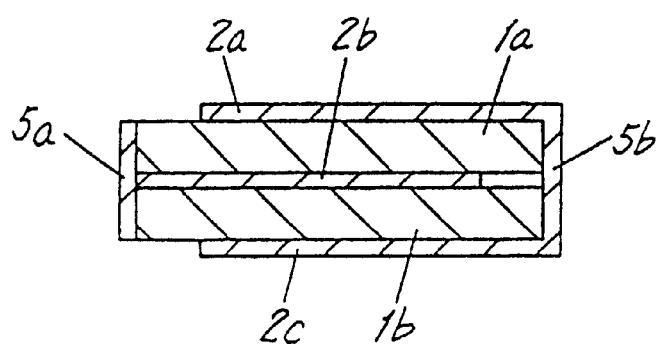
Figure 22:
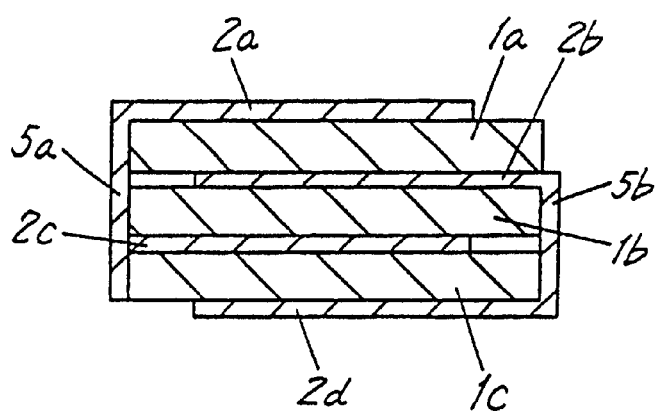
Figure 23:
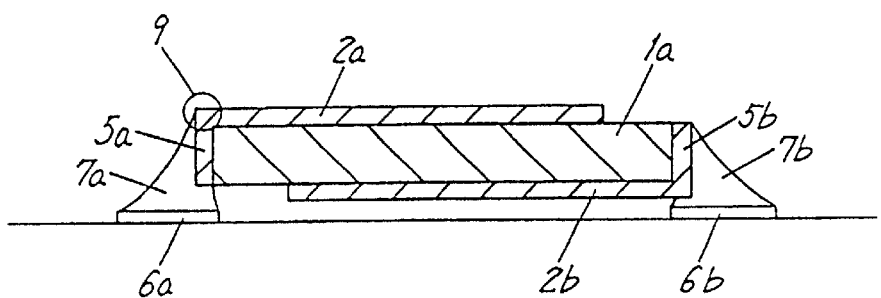
FIG. 23 is a sectional view showing the chip PTC thermistor of FIG. 22 (a) mounted on a printed circuit board.

FIGS. 20(*a*) and(*b*) are sectional views showing examples of triple laminate samples respectively with cracks (thickness of the nickel plating layer 20 μm) and without cracks (thickness of the nickel plating layer 40 μm) observed after the thermal shock test.

FIGS. 20(*a*) and(*b*) show solder fillets 91*a* and 91*b*, lands 92*a* and 92*b* on the printed circuit board and side electrodes 93*a* and 93*b* made with a nickel plating layer of 20 μm in thickness. The reference numeral 94 indicates the location where cracks are observed after the thermal shock test.

Side electrodes 95*a* and 95*b* are made of a nickel plating layer of 40 μm in thickness.

As FIG. 20(*a*) shows, in the case of the sample whose nickel plating layer is thin and suffers cracks, the part of the side electrode 93*a* near the printed circuit board is warped outward. The cause of the warp is thermal expansion of the conductive polymers that occurs during soldering or shrinkage stress applied when the solder solidifies. Due to the outward warping of the side electrode 93*a*, stress applied during the thermal shock test focuses on the second internal layer main electrode 65*c* which is coupled to the warping part, triggering the cracks.

In the case of the sample with a thicker nickel plating shown in FIG. 20(*b*), the side electrode 95*a* is not warped by the thermal expansion of the conductive polymer or the shrinkage stress applied by the solidification of the soldering. Thus, the stress does not focus on the second internal layer main electrode 65*c*, thereby preventing cracks.

As thus far described, according to the third preferred embodiment of the present invention, a surface mountable chip PTC thermistor having a long term connection reliability between the side electrodes 63*a* and 63*b* and the main electrodes 62*a* and 62*c* as well as the sub electrodes 62*b* and 62*d* can be obtained even when it is formed such that the conductive polymer and the metallic foil are alternately laminated in order to increase the current-carrying capacity while reducing the size.

No upper limit for the thickness is particularly specified. However, when considering the ease of mounting (for example , the ease of suction) by an automatic mounting equipment, the process of dicing into independent elements and the time needed for the plating process, the thickness of the nickel plating layer is preferably not more than four twentieths of the distance between the first and second main electrodes 62*a* and 62*c*.

In the foregoing first through third preferred embodiments of the present invention, the first side electrodes 13*a*, 43*a*, and 63*a*, and the second side electrodes 13*b*, 43*b*, and 63*b* are made of a nickel plating layer, however, the same effects can be obtained with a nickel alloy plating layer.

Applicability in the Industry

The chip PTC thermistor of the present invention comprises the following elements;

a) a rectangular parallelopiped conductive polymer having PTC properties;

b) a first main electrode disposed on a first face of the conductive polymer;

c) a first sub electrode disposed independently, but on the same face as the first electrode;

d) a second main electrode disposed on a second face opposite the first face of the conductive polymer;

e) a second sub electrode disposed independently, but on the same face as the second main electrode;

f) a first side electrode folding around and over the entire surface of one of side faces of the conductive polymer extending to the part of the first main electrode and the second sub electrode in such a manner that it electrically couples the two electrodes; and g) a second side electrode folding around and over the entire surface of the other side face, opposite the side face mentioned previously, of the conductive polymer, extending to the part of the first sub electrode and the second main electrode in such a manner that it electrically couples the two electrodes.

wherein, the first and second side electrodes comprise a nickel plating layer or nickel alloy plating layer whose thickness is not less than one twentieth of the distance between the first and second main electrodes.

In the case of this construction, the side electrodes fold around and over not only the entire surface on the side face of the conductive polymer but also end surfaces of the main and sub electrodes. As such, the side electrodes and the main and sub electrodes are not linearly coupled but coupled with the faces. Furthermore, the side electrodes are made with nickel which is mechanically strong and formed with a plating layer of an even thickness equal to or thicker than one twentieth of the distance between the first and second main electrodes. Thus, the chip PTC thermistor of the present invention is surface mountable and shows a superior long-term reliability in terms of connections between the main and the side electrode and between the sub electrode and the side electrode.

What is claimed is:

1. A chip PTC thermistor comprising:

a) a rectangular parallelopiped conductive polymer having a PTC property;

b) a first main electrode disposed on a first face of said conductive polymer;

c) a first sub electrode disposed independently, but on the same face as said first main electrode;

d) a second main electrode disposed on a second face opposite the first face of said conductive polymer;

e) a second sub electrode disposed independently, but on the same face as said second main electrode;

f) a first side electrode directly disposed on one of side faces of said conductive polymer, maid first side electrode being disposed around and over an entire surface of said one of side faces extending to maid first main electrode and said second sub electrode, and electrically coupling said first main electrode and said second sub elactrode; and g) a second side electrode directly disposed on a side face, opposite said one of side faces, of said conductive polymer, said second side electrode being disposed around and over an entire surface of said opposite side face extending to said first sub electrode and said second main electrode, and electrically coupling said first sub electrode and said second main electrode, wherein said first and second side electrodes comprise a nickel plating layer or a nickel alloy plating layer and a thickness of said first and second main electrode is a half of a thickness of said conductive polymer between said first and second main electrodes.

* * * * *

UNITED STATES PATENT AND TRADEMARK OFFICE
CERTIFICATE OF CORRECTION

PATENT NO.   : 6,441,717 B1
DATED        : August 27, 2002
INVENTOR(S)  : Takashi Ikeda et al.

It is certified that error appears in the above-identified patent and that said Letters Patent is hereby corrected as shown below:

<u>Column 14,</u>
Lines 26 and 28, change "maid" to -- said --.

Signed and Sealed this

Seventeenth Day of June, 2003

JAMES E. ROGAN
*Director of the United States Patent and Trademark Office*